(12) United States Patent
Yao

(10) Patent No.: US 9,331,876 B2
(45) Date of Patent: *May 3, 2016

(54) METHOD, APPARATUS AND SYSTEM FOR CONTROLLING CARRIER POWER AMPLIFIER OF BASE STATION

(71) Applicant: HUAWEI TECHNOLOGIES CO., LTD., Shenzhen, Guangdong (CN)

(72) Inventor: Guoqiang Yao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 37 days.

This patent is subject to a terminal disclaimer.

(21) Appl. No.: 14/208,816

(22) Filed: Mar. 13, 2014

(65) Prior Publication Data
US 2014/0204993 A1    Jul. 24, 2014

Related U.S. Application Data

(63) Continuation of application No. 13/217,733, filed on Aug. 25, 2011, now Pat. No. 8,792,931, which is a continuation of application No. PCT/CN2010/070552, filed on Feb. 5, 2010.

(30) Foreign Application Priority Data

Feb. 26, 2009    (CN) .......................... 2009 1 0078367

(51) Int. Cl.
H04B 7/00    (2006.01)
H04L 25/49   (2006.01)
(Continued)

(52) U.S. Cl.
CPC .......... *H04L 25/4902* (2013.01); *H03G 3/3047* (2013.01); *H04W 52/0206* (2013.01);
(Continued)

(58) Field of Classification Search
USPC .............. 455/522, 67.11, 68–70, 115.3, 126, 455/127.1, 127.2, 135, 226.3, 277.2, 296; 370/318
See application file for complete search history.

(56) References Cited

U.S. PATENT DOCUMENTS 5,903,854 A    5/1999   Abe et al.
6,111,459 A *  8/2000   Nishijima ............... H03F 3/602
                                                     330/124 D
(Continued)

FOREIGN PATENT DOCUMENTS

CN    1697530    11/2005
CN    1741640    3/2006
(Continued)

OTHER PUBLICATIONS

Notice of Allowance, dated Dec. 23, 2013, in corresponding U.S. Appl. No. 13/217,733 (9 pp.).

(Continued)

*Primary Examiner* — Dominic Rego
(74) *Attorney, Agent, or Firm* — Staas & Halsey LLP

(57) ABSTRACT

A method, an apparatus, and a system for controlling a carrier Power Amplifier (PA) of a Base Station (BS) in a network communication field are disclosed. The method includes: obtaining power control information of the carrier PA at a next timeslot; and adjusting working voltage of the carrier PA at the next timeslot according to the power control information. An apparatus and a system for controlling a carrier PA of a BS are also disclosed. The method, apparatus, and system can reduce energy consumption of the BS and improve energy efficiency of the BS.

7 Claims, 2 Drawing Sheets

(51) Int. Cl.
  *H03G 3/30*     (2006.01)
  *H04W 52/22*    (2009.01)
  *H04W 52/02*    (2009.01)
  *H04W 88/08*    (2009.01)
  *H04B 1/04*     (2006.01)

(52) U.S. Cl.
  CPC ............ *H04W52/22* (2013.01); *H04W 52/223* (2013.01); *H04W 88/08* (2013.01); *H04B 2001/0408* (2013.01); *H04B 2001/0416* (2013.01); *H04W 52/228* (2013.01); *Y02B 60/50* (2013.01)

(56) References Cited

U.S. PATENT DOCUMENTS

| | | | |
|---|---|---|---|
| 6,556,629 | B1 | 4/2003 | Evans |
| 6,728,520 | B2 | 4/2004 | Coan et al. |
| 7,392,011 | B1* | 6/2008 | Jacomb-Hood ........ H01Q 1/288 342/368 |
| 7,539,468 | B2 | 5/2009 | Tsuda |
| 2002/0090920 | A1 | 7/2002 | McCune |
| 2002/0186076 | A1* | 12/2002 | Hareyama ............. H03F 1/0238 330/51 |
| 2005/0127992 | A1 | 6/2005 | Schell et al. |
| 2007/0247214 | A1 | 10/2007 | Lin et al. |
| 2008/0025086 | A1 | 1/2008 | Chiang et al. |
| 2008/0211583 | A1* | 9/2008 | Nguyen ................ H03F 1/0211 330/297 |
| 2009/0209279 | A1 | 8/2009 | Kuroda et al. |
| 2010/0112966 | A1 | 5/2010 | Yin et al. |

FOREIGN PATENT DOCUMENTS

| | | |
|---|---|---|
| CN | 1790897 | 6/2006 |
| CN | 1801795 | 7/2006 |
| CN | 1859657 | 11/2006 |
| CN | 101080047 | 11/2007 |
| CN | 101114860 | 1/2008 |
| CN | 101179814 | 5/2008 |
| CN | 101489299 | 7/2009 |
| WO | WO2007/111132 | 10/2007 |
| WO | WO2009/009987 | 1/2009 |

OTHER PUBLICATIONS

Chinese Office Action, dated Feb. 12, 2010, in corresponding Chinese Application No. 200910078367.4.
International Search Report and Written Opinion, dated May 13, 2010, in corresponding International Application No. PCT/CN2010/070552.
Chinese Office Action, dated Aug. 31, 2011, in corresponding Chinese Application No. 200910078367.4.
Extended European Search Report, dated Dec. 6, 2011, in corresponding European Application No. 10745811.9.
Office Action, dated Jul. 17, 2013, in corresponding U.S. Appl. No. 13/217,733.
Communication Pursuant to Article 94(3) EPC, dated Jul. 17, 2013, in corresponding European Application No. 10745811.9.
Notice of Allowance, dated Dec. 23, 2013, in corresponding U.S. Appl. No. 13/217,733.
Chinese Search Report, dated Jan. 20, 2014, in corresponding Chinese Application No. 201210090531.5.
Chinese Office Action, dated Jan. 27, 2014, in corresponding Chinese Application No. 201210090531.5.
U.S. Appl. No. 13/217,733, filed Aug. 25, 2011, Guoqiang Yao, Huawei Technologies Co., LTD. of Shenzhen, P.R. China.

* cited by examiner

METHOD, APPARATUS AND SYSTEM FOR CONTROLLING CARRIER POWER AMPLIFIER OF BASE STATION

CROSS-REFERENCE TO RELATED APPLICATIONS

This application is a continuation of U.S. patent application Ser. No. 13/217,733, filed on Aug. 25, 2011, which is a continuation of International Application No. PCT/CN2010/070552, filed on Feb. 5, 2010. The International Application claims priority to Chinese Patent Application No. 200910078367.4, filed on Feb. 26, 2009. The afore-mentioned patent applications are hereby incorporated by reference in their entireties.

FIELD OF THE INVENTION

Embodiments of the present invention relate to the communication field, and in particular, to a method, an apparatus, and a system for controlling a carrier Power Amplifier (PA) of a Base Station (BS).

BACKGROUND OF THE INVENTION

The Global System for Mobile Communications (GSM) network provides the widest coverage across the globe, and improving energy efficiency of the GSM network is critical to sustainable development of the GSM network. To reduce the energy consumption of a GSM BS, a method for controlling power of a GSM BS is provided in the prior art. This method detects whether each timeslot is occupied. When a timeslot is idle, a PA control unit outputs a low level to the grid voltage of the PA, and therefore, the PA works in the cutoff zone at the idle timeslot, namely, the PA is cut off and the static power consumption of the PA is zero. In this way, the energy consumption of the idle GSM BS is reduced.

In the prior art, the working state of the PA is adjusted by controlling the grid voltage of the PA, and the energy consumption of a GSM BS is reduced when the timeslots of the GSM BS are idle; however, when the timeslots of the GSM BS are occupied, it is impossible to improve the energy efficiency of the GSM BS or reduce the energy consumption of the GSM BS.

SUMMARY OF THE INVENTION

According to one aspect, an embodiment of the present invention provides a method for controlling a carrier PA of a BS, where the method includes:

obtaining power control information of the carrier PA at a next timeslot; and adjusting working voltage of the carrier PA at the next timeslot according to the power control information.

According to another aspect, an embodiment of the present invention provides an apparatus for controlling a carrier PA of a BS, where the apparatus includes:

an obtaining unit, configured to obtain power control information of the carrier PA at a next timeslot; and an adjusting unit, configured to adjust working voltage of the carrier PA at the next timeslot according to the power control information.

According to still another aspect, an embodiment of the present invention provides a BS system, including the foregoing apparatus for controlling the carrier PA of the BS.

It can be known from the foregoing technical solutions that, the power control information at the next timeslot is obtained as a basis for controlling the working voltage of the PA at the next timeslot. Therefore, the working voltage of the PA may be adjusted according to the power control information, which reduces the energy consumption of the BS and improves the energy efficiency of the BS.

DETAILED DESCRIPTION OF THE EMBODIMENTS

An embodiment of the present invention provides a method for controlling a carrier PA of a BS. The method includes: obtaining power control information of the carrier PA at a next timeslot; and controlling working voltage of the carrier PA at the next timeslot according to the power control information. With this method, the power control information at the next timeslot is obtained as a basis for controlling the working voltage of the carrier PA at the next timeslot. Therefore, the working voltage of the carrier PA may be adjusted according to the power control information, which reduces the energy consumption of the BS and improves the energy efficiency of the BS.

To make the technical solutions of the embodiments of the present invention clearer, the following describes the embodiments of the present invention in detail with reference to the accompanying drawings.

Figure 1:
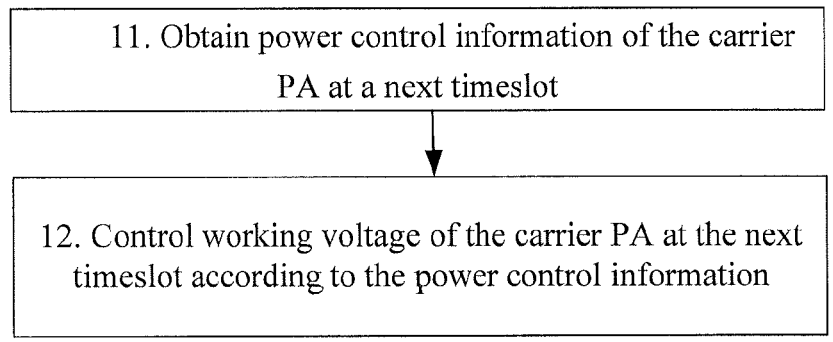
FIG. 1 is a flowchart of a method for controlling a carrier PA of a BS according to an embodiment of the present invention.

As shown in FIG. 1, an embodiment of the present invention provides a method for controlling a carrier PA of a BS. The method includes the following steps:

Step 11: Obtain power control information of the carrier PA at a next timeslot.

This step may include: obtaining power control information of the carrier PA at the next timeslot from a baseband processing unit. If a single carrier is configured for this carrier PA, the power control information may include: output power of the carrier, channel modulation type, and PA switch. If multiple carriers are configured for this carrier PA, the power control information may include: output power of each carrier, channel modulation type corresponding to each carrier, PA switch of each carrier, and the number of carriers in the channel.

Step 12: Control working voltage of the carrier PA at the next timeslot according to the power control information.

In this embodiment, the working voltage of the carrier PA may be the drain working voltage of the carrier PA.

This step may include: calculating the working voltage of the carrier PA at the next timeslot according to the power control information, and then adjusting the working voltage of the PA to the calculated working voltage upon arrival of the next timeslot. For example, the working voltage of the carrier PA is adjusted in the interval between the current timeslot and the next timeslot. Certainly, in practice, the adjustment of the working voltage of the carrier PA may be triggered by a timeslot synchronization signal.

Optionally, the step of calculating the working voltage of the carrier PA at the next timeslot according to the power control information may include: (a) calculating the output power of the carrier PA at the next timeslot according to the obtained power control information of the next timeslot, where the detailed calculation method may be: if a single carrier is configured for the carrier PA, calculating the output power of the carrier according to the power control information of the carrier PA, and using the output power of the carrier as the output power of the carrier PA at the next timeslot; or if multiple carriers are configured for the carrier PA, calculating the output power of each carrier according to the power control information of the carrier PA, and using the sum of output power of all carriers as the output power of the carrier PA at the next timeslot; (b) comparing the output power of the carrier PA with a power gain curve of the carrier PA (namely, a curve between the output power and the power gain under different working voltage) to obtain the working voltage corresponding to the output power of the carrier PA at the next timeslot, where the carrier PA works in a linear amplification zone under the working voltage of the next timeslot.

Preferably, when the output power of the PA fulfills the carrier requirements, lower PA working voltage that enables the PA to work in the linear amplification zone may be selected as working voltage at the next timeslot. In this way, the carrier PA can achieve high efficiency.

With the method provided in this embodiment, the working voltage of the carrier PA at the next timeslot is controlled according to the obtained power control information of the carrier PA at the next timeslot. For example, when the next timeslot of the carrier PA of the BS is idle, the working voltage of the carrier PA at the next timeslot is zero, the carrier PA is cut off, and the static power consumption is zero; when the next timeslot of the carrier PA of the BS is occupied, appropriate working voltage of the carrier PA at the next timeslot may be selected to achieve higher efficiency of the PA.

In this embodiment, the working voltage of the carrier PA of the BS at the next timeslot is adjusted, which may achieve higher efficiency of the PA, reduce energy consumption of the BS, and improve the energy efficiency of the BS. Moreover, with the method provided in this embodiment, the supply voltage of the PA may change in the interval between the current timeslot and the next timeslot, and therefore, the working voltage of the PA changes without affecting the Radio Frequency (RF) indexes output by the PA.

Figure 2:
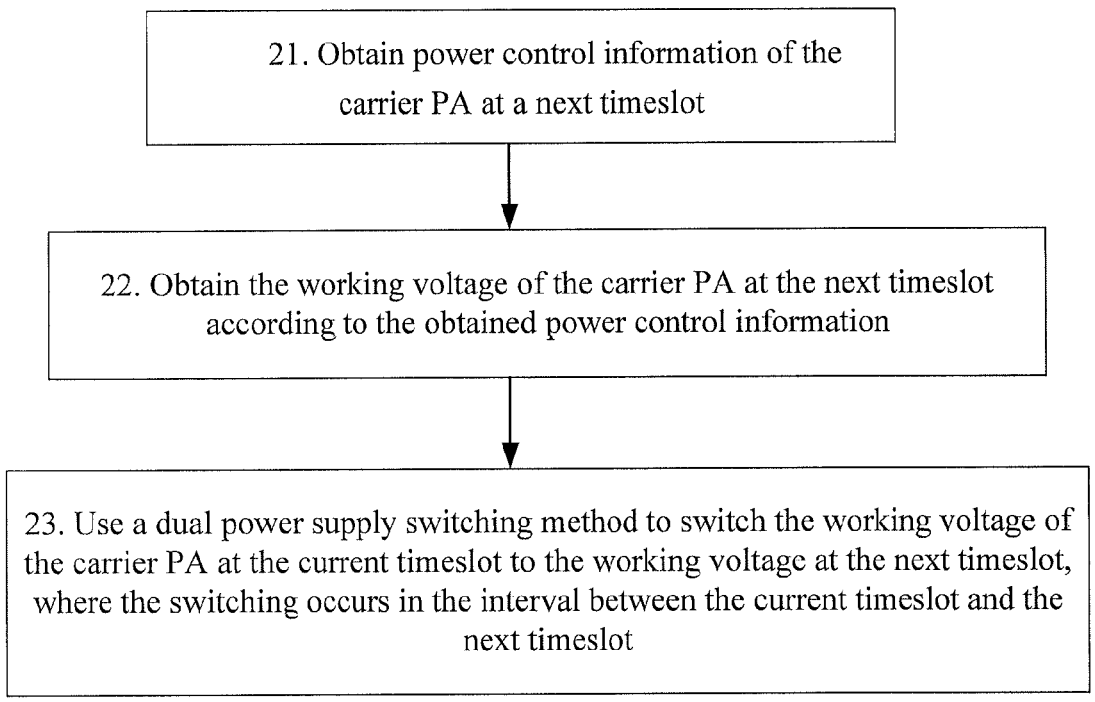
FIG. 2 is a flowchart of a method for controlling a carrier PA of a BS according to another embodiment of the present invention.

Another embodiment of the present invention provides a method for controlling a carrier PA of a BS. The implementation scenario of this embodiment is: A dual power supply switching method is used to adjust the voltage of the carrier PA, and it is assumed that the voltage of the PA at the current timeslot is U1 and that the working voltage of the PA at the next timeslot is U2. As shown in FIG. 2, the method includes the following steps:

Step 21: Obtain power control information of the carrier PA at a next timeslot.

The power control information in this step may include: output power of the carrier, channel modulation type, and PA switch.

Step 22: Obtain the working voltage of the carrier PA at the next timeslot according to the obtained power control information.

For the detailed method for obtaining the working voltage of the carrier PA at the next timeslot, refer to the relevant description in step 12, which is not repeatedly described here.

Step 23: Use a dual power supply switching method to switch the working voltage of the carrier PA at the current timeslot to the PA working voltage at the next timeslot, where the switching occurs in the interval between the current timeslot and the next timeslot.

The dual power supply switching method in step 23 may be: Two power supplies are set in the carrier of the BS, and each power supply adjusts the voltage separately; if power supply 1 supplies power to the carrier PA at the current timeslot and the supply voltage is U1, the supply voltage of power supply 2 is adjusted to U2, and the power supply switch is enabled to switch the power supply of the carrier PA to power supply 2 in the interval between the current timeslot and the next timeslot; if power supply 2 supplies power to the carrier PA at the current timeslot and the supply voltage is U1, the supply voltage of power supply 1 is adjusted to U2, and the power supply switch is enabled to switch the power supply of the carrier PA to power supply 1 in the interval between the current timeslot and the next timeslot.

With the method provided in this embodiment, the working voltage of the power supply of the PA at the next timeslot is controlled according to the obtained control power information of the next timeslot, and a dual power supply switching method is used to ensure that the PA of the BS employs the working voltage of the next timeslot. Therefore, the power consumption of the BS is reduced, and the energy efficiency of the BS is improved. Moreover, with the method provided in this embodiment, the working voltage of the PA changes in the interval between the current timeslot and the next timeslot, and therefore, the working voltage of the PA changes without affecting the indexes output by the carrier PA.

Figure 3:
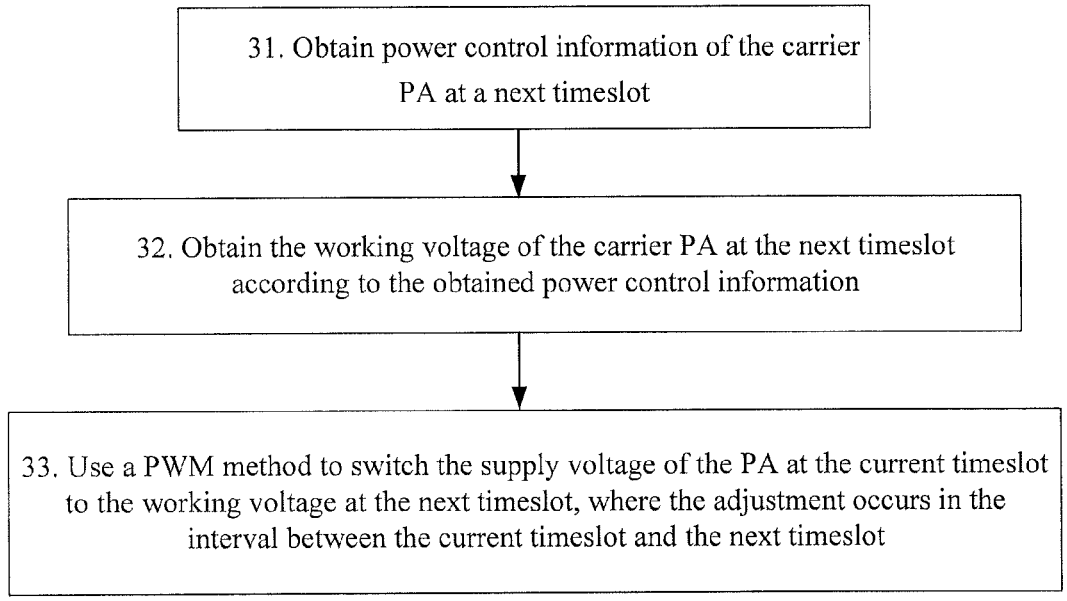
FIG. 3 is a flowchart of a method for controlling a carrier PA of a BS according to still another embodiment of the present invention.

An embodiment of the present invention also provides a method for controlling a carrier PA of a BS. The implementation scenario of this embodiment is: A Pulse-Width Modulation (PWM) method is used to adjust the voltage, namely, the voltage regulation speed of a single power supply is quickened to meet the requirement for timeslot-level voltage regulation; and it is assumed that the voltage of the PA at the current timeslot is U1 and that the working voltage of the PA at the next timeslot is U2. As shown in FIG. 3, the method includes the following steps:

Steps 31 to 32 are the same as steps 21 to 22.

Step 33: Use a PWM method to adjust the supply voltage of the PA at the current timeslot to the working voltage at the next timeslot, where the adjustment occurs in the interval between the current timeslot and the next timeslot.

Supposing the duty ratio of the PWM control signal corresponding to the supply voltage (U1) of the PA at the current timeslot is PWM1, and the duty ratio of the PWM control signal corresponding to the working voltage (U2) of the PA at the next timeslot is PWM2, the PWM method in step 33 may be: switching the duty ratio of the PWM control signal of the power supply of the carrier PA from PWM1 to PWM2.

With the method provided in this embodiment, the working voltage of the power supply of the PA at the next timeslot is controlled according to the obtained control power information of the next timeslot, and a PWM method is used to ensure that the carrier PA of the BS employs the working voltage of the next timeslot. Therefore, the power consumption of the BS is reduced, and the energy efficiency of the BS is improved. Moreover, with the method provided in this embodiment, the working voltage of the PA changes in the interval between the current timeslot and the next timeslot, and therefore, the working voltage of the PA changes without affecting the indexes output by the carrier PA.

Figure 4:
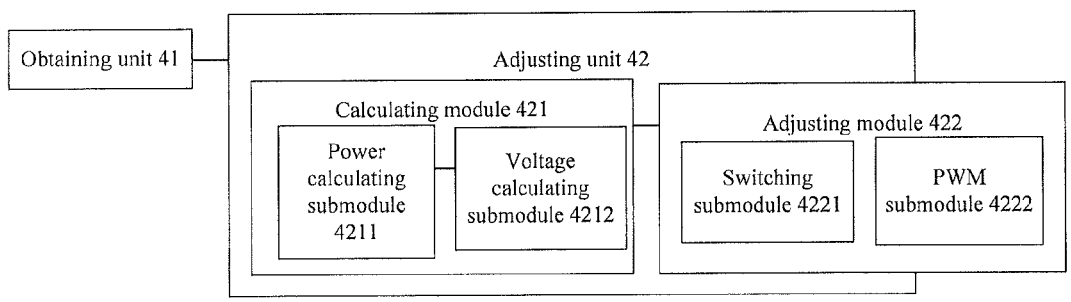
FIG. 4 is a structural diagram of an apparatus for controlling a carrier PA of a BS according to an embodiment of the present invention.

An embodiment of the present invention also provides an apparatus for controlling a carrier PA of a BS. As shown in FIG. 4, the apparatus includes: an obtaining unit 41, configured to obtain power control information of the carrier PA at a next timeslot; and an adjusting unit 42, configured to adjust working voltage of the carrier PA at the next timeslot according to the power control information.

Optionally, the adjusting unit 42 may include:

a calculating module 421, configured to calculate the working voltage of the carrier PA at the next timeslot according to the power control information; and an adjusting module 422, configured to adjust the working voltage of the carrier PA to the calculated working voltage at the next timeslot in the interval between the current timeslot and the next timeslot.

Optionally, the calculating module 421 may include:

a power calculating submodule 4211, configured to calculate the output power of the carrier at the next timeslot according to the power control information if a single carrier is configured for the carrier PA, and use the calculated output power as the output power of the carrier PA at the next timeslot; or configured to calculate the output power of each carrier at the next timeslot according to the power control information if multiple carriers are configured for the carrier PA, and use the sum of output power of all carriers at the next timeslot as the output power of the carrier PA at the next timeslot; and a voltage calculating submodule 4212, configured to: compare the output power of the carrier PA with the power gain curve of the carrier PA to obtain the working voltage corresponding to the output power of the carrier PA at the next timeslot, and use this working voltage as the working voltage of the carrier PA at the next timeslot.

Optionally, the adjusting module 422 may include:

a switching submodule 4221, configured to switch the working voltage of the carrier PA to the working voltage at the next timeslot in the interval between the current timeslot and the next timeslot by using a dual power supply switching method.

Or, the adjusting module 422 may include:

a PWM submodule 4222, configured to adjust the working voltage of the carrier PA to the working voltage at the next timeslot in the interval between the current timeslot and the next timeslot by using a PWM method.

The foregoing embodiment is applicable not only to GSM BSs, but also to BSs of other standards such as Wideband Code Division Multiple Access (WCDMA) and Time Division-Synchronous Code Division Multiple Access (TD-SCDMA).

With the apparatus provided in this embodiment, after the obtaining module 41 obtains the power control information of the carrier PA at the next timeslot, the adjusting unit 42 controls the working voltage of the carrier PA at the next timeslot according to the power control information. Therefore, the working voltage of the carrier PA of the BS at the next timeslot is ensured, the power consumption of the BS is reduced, and the power efficiency of the BS is improved. Moreover, the adjusting module 422 changes the supply voltage of the PA in the interval between the current timeslot and the next timeslot, and therefore, the working voltage of the PA changes without affecting the indexes output by the PA.

An embodiment of the present invention also provides a BS system. The BS system includes an apparatus for controlling the carrier PA. The apparatus for controlling the carrier PA includes: an obtaining unit, configured to obtain power control information of the carrier PA at a next timeslot; and an adjusting unit, configured to adjust working voltage of the carrier PA at the next timeslot according to the power control information.

With the system provided in this embodiment, the obtaining unit in the apparatus for controlling the carrier PA obtains the power control information of the carrier PA at the next timeslot, and the adjusting unit controls the working voltage of the carrier PA at the next timeslot according to the power control information. Therefore, the working voltage of the carrier PA of the BS at the next timeslot is ensured, the power consumption of the BS is reduced, and the power efficiency of the BS is improved.

In the embodiments of the present invention, the word "obtain" and variations thereof refer to obtaining information from another module actively or receiving information sent by another module.

It is understandable to those skilled in the art that the accompanying drawings are only schematic diagrams of the exemplary embodiments, and that the modules or processes in the accompanying drawings are not mandatory for implementing the present invention.

Persons of ordinary skill in the art should understand that all or part of the steps of the method specified in any embodiment of the present invention may be implemented by a program instructing relevant hardware. The program may be stored in a computer readable storage medium. When the program runs, the program executes one or more steps in the method embodiments of the present invention.

In addition, all functional units in the embodiments of the present invention may be integrated into a processing module or exist separately, or two or more of the units are integrated into one module. The integrated module may be hardware or a software module. When being implemented as a software module and sold or used as a stand-alone product, the integrated module may be stored in a computer-readable storage medium.

The storage medium may be a Read Only Memory (ROM), a magnetic disk, or a Compact Disk-Read Only Memory (CD-ROM).

In conclusion, the technical solutions of the embodiments of the present invention bring the benefits of reducing energy consumption of the BS and improving energy efficiency of the BS.

The preceding descriptions are merely exemplary embodiments of the present invention, but not intended to limit the scope of the present invention. Any modifications, variations or replacements that can be easily derived by those skilled in the art shall fall within the scope of the present invention. Therefore, the scope of the present invention is subject to the appended claims.

What is claimed is:

1. A method for controlling a carrier Power Amplifier (PA) of a Base Station (BS), comprising:

obtaining power control information of the carrier PA at a next timeslot; and adjusting a drain working voltage of the carrier PA at the next timeslot to a calculated drain working voltage according to the power control information.

2. The method according to claim 1, wherein:

the drain working voltage of the carrier PA at the next time slot is adjusted in the following way:

switching the drain working voltage of the carrier PA to the calculated drain working voltage at the next timeslot by using a dual power supply switching method; or adjusting the drain working voltage of the carrier PA to the calculated drain working voltage at the next timeslot by using a Pulse-Width Modulation (PWM) method.

3. The method according to claim 2, wherein:
the adjusting the drain working voltage of the carrier PA at the next time slot comprises:
adjusting the drain working voltage of the carrier PA to the calculated drain working voltage at the next timeslot in an interval between a current timeslot and the next timeslot.

4. The method according to claim 1, wherein:
the adjusting the drain working voltage of the carrier PA at the next time slot comprises:
adjusting the drain working voltage of the carrier PA to the calculated drain working voltage at the next timeslot as triggered by a timeslot synchronization signal.

5. An apparatus for controlling a carrier Power Amplifier (PA) of a Base Station (BS), comprising:
non-transitory computer readable storage medium to store program(s), and
computer hardware configured, including configured by the program(s), to:
obtain power control information of the carrier PA at a next timeslot; and
adjust a drain working voltage of the carrier PA at the next timeslot to a calculated drain working voltage according to the power control information.

6. The apparatus according to claim 5, wherein the drain working voltage of the carrier PA at the next time slot is adjusted in the following way:
switch the drain working voltage of the carrier PA to the working voltage at the next timeslot in an interval between a current timeslot and the next timeslot by using a dual power supply switching method; or
adjust the drain working voltage of the carrier PA to the working voltage at the next timeslot in an interval between a current timeslot and the next timeslot by using a Pulse Width Modulation (PWM) method.

7. A Base Station (BS) system, comprising:
an apparatus for controlling a carrier Power Amplifier (PA) of the BS, the apparatus comprising:
non-transitory computer readable storage medium to store program(s), and computer hardware configured, including configured by the program(s), to:
obtain power control information of the carrier PA at a next timeslot; and
adjust a drain working voltage of the carrier PA at the next timeslot to a calculated drain working voltage according to the power control information.

* * * * *